United States Patent [19]

Hachiuma

[11] Patent Number: 5,111,156
[45] Date of Patent: May 5, 1992

[54] CURRENT AMPLIFIER CIRCUIT

[75] Inventor: Masayuki Hachiuma, Kawasaki, Japan

[73] Assignee: Kabushiki Kaisha Toshiba, Kawasaki, Japan

[21] Appl. No.: 619,604

[22] Filed: Nov. 29, 1990

[30] Foreign Application Priority Data

Dec. 1, 1989 [JP] Japan .................................. 1-312551

[51] Int. Cl.$^5$ ............................................... H03F 3/45
[52] U.S. Cl. .................................... 330/257; 330/260; 330/308
[58] Field of Search ................. 330/59, 253, 257, 259, 330/260, 308; 250/214 A

[56] References Cited

U.S. PATENT DOCUMENTS 4,338,527 7/1982 Nagano ........................... 330/257 X Primary Examiner—James B. Mullins
Attorney, Agent, or Firm—Banner, Birch, McKie & Beckett

[57] ABSTRACT

In a current amplifier circuit having a feedback type operational amplifier, the operational amplifier has at an output stage a signal detecting transistor through which a signal current flowing through the feedback loop flows. The current amplifier circuit further comprises a bias current adder circuit, a bias current subtractor circuit, and a reference bias generator. The bias current adder circuit allows a bias current to flow steadily through the signal current detecting transistor of the operational amplifier. The bias current subtracter circuit has a further transistor through which a current flows of a magnitude equal to the sum current of the signal current flowing through the signal current detecting transistor and the bias current, and subtracts the bias current from the current flowing through the transistor to output only the signal current. The reference bias generator circuit determines a magnitude of the bias current.

17 Claims, 8 Drawing Sheets

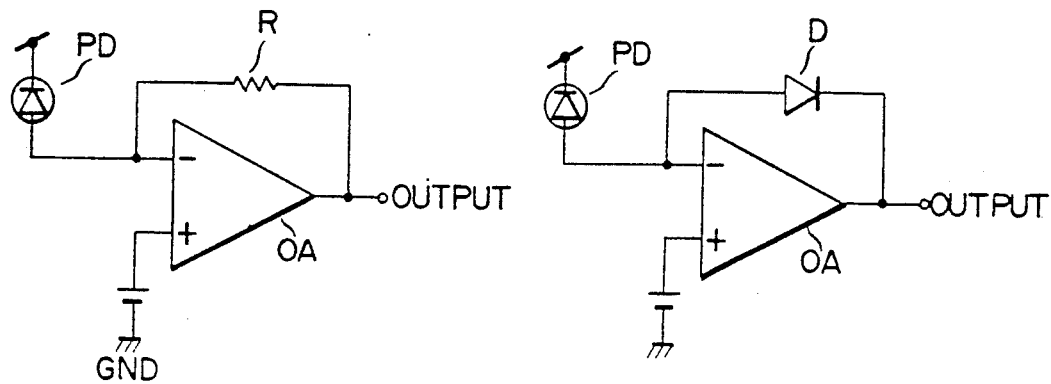
FIG. 1 PRIOR ART    FIG. 2 PRIOR ART
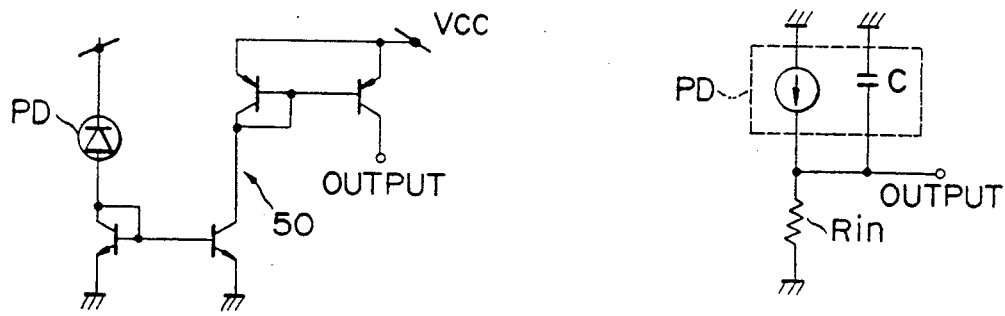
FIG. 3A
PRIOR ART
FIG. 3B
PRIOR ART

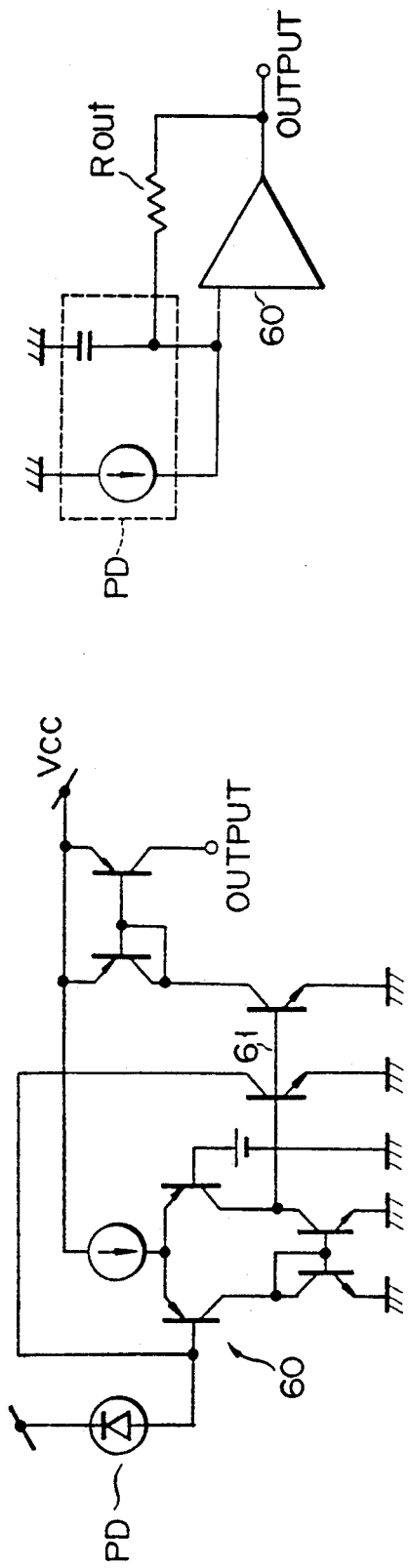
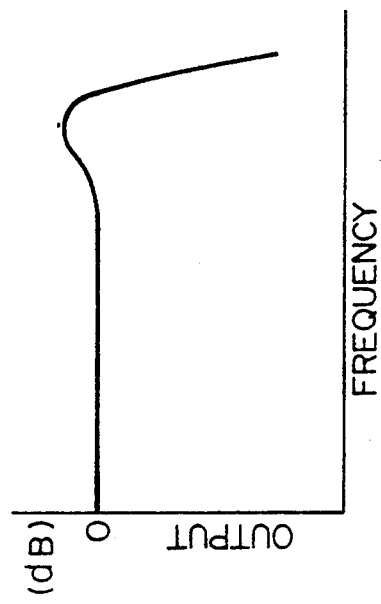
FIG. 4A PRIOR ART
FIG. 4B PRIOR ART
FIG. 5 PRIOR ART

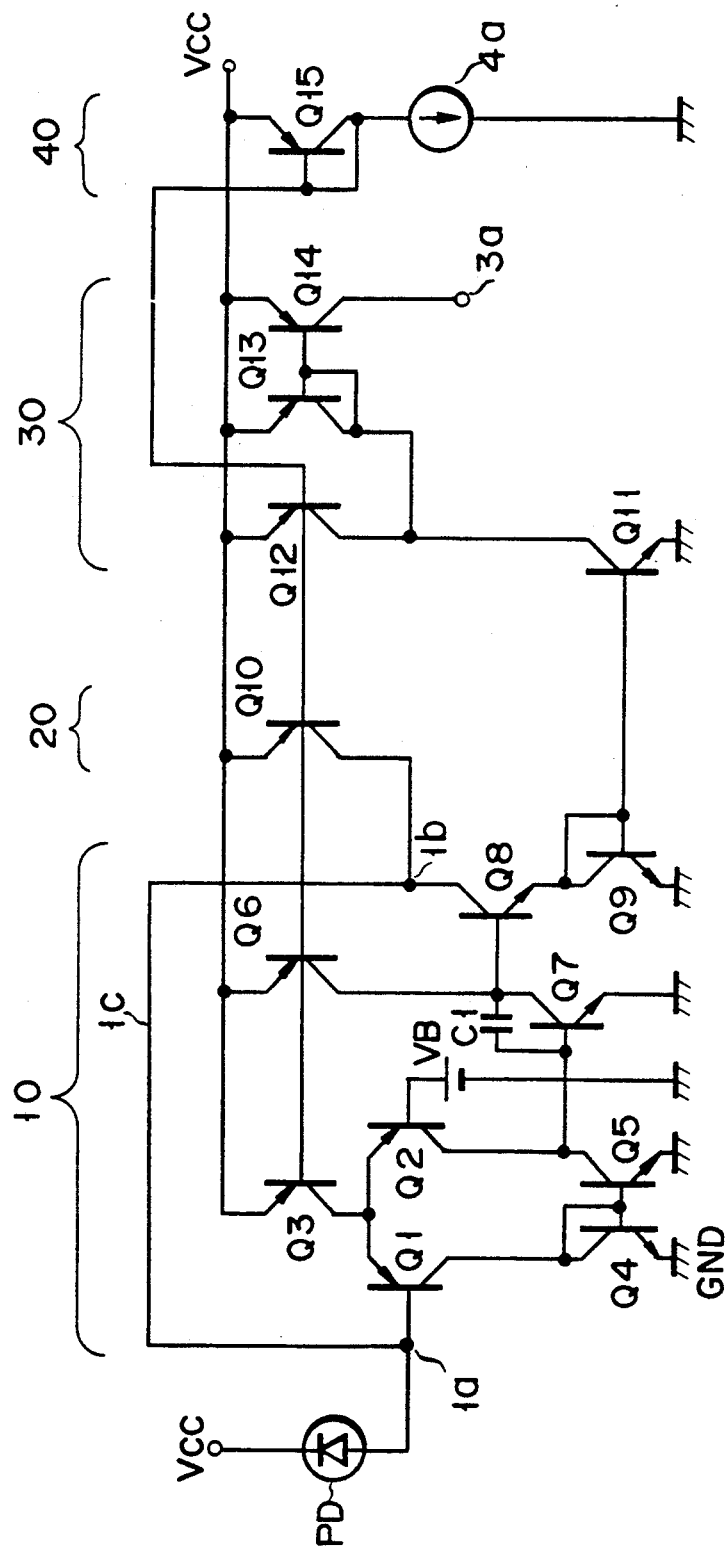
F I G. 6

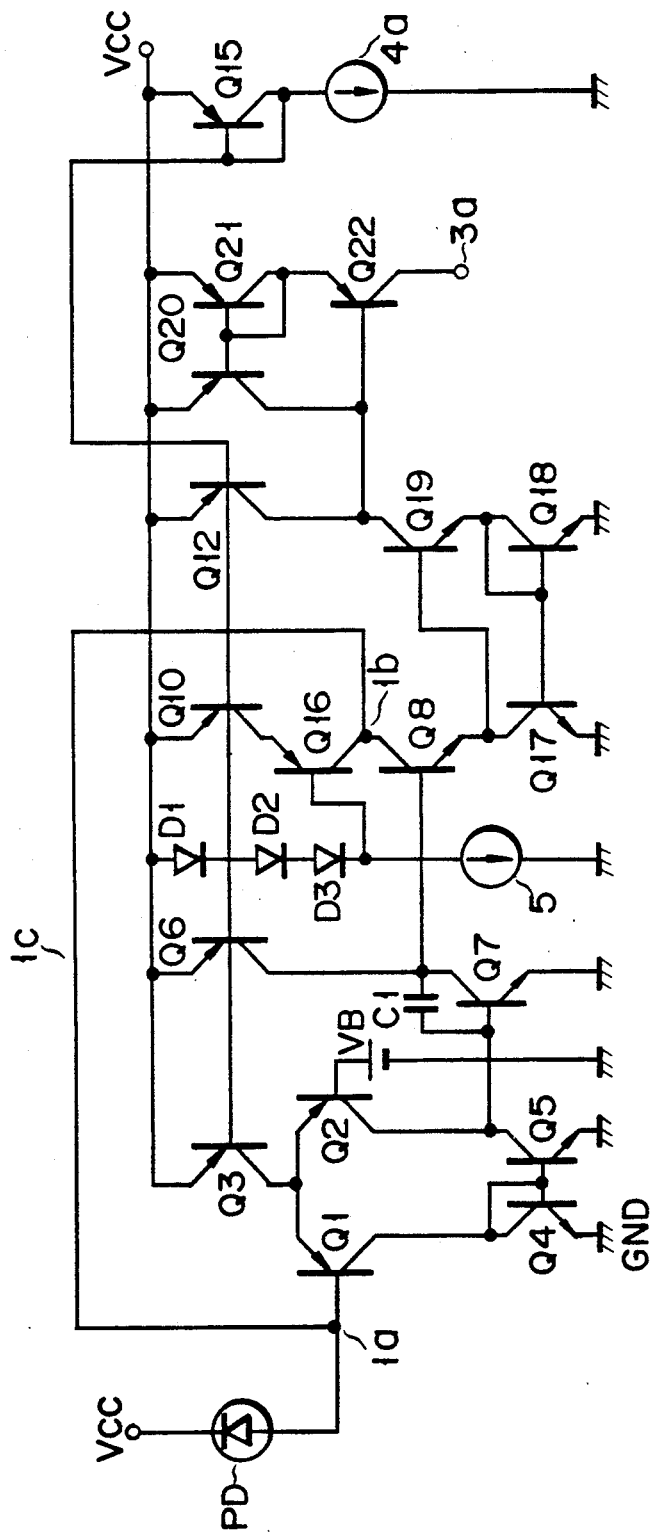
F I G. 9

CURRENT AMPLIFIER CIRCUIT

BACKGROUND OF THE INVENTION

1. Field of the Invention

The present invention relates to a current amplifier circuit whose circuit has been integrated and which is particularly used for a preamplifier circuit and the like for amplifying a current signal input from a current signal source having a high output resistance such as a photo diode.

2. Description of the Related Art

As a preamplifier circuit for amplifying a current signal input from a photo diode, various amplifier circuits described later have been heretofore used.

That is, an amplifier circuit shown in FIG. 1 receives a current signal input from a photo diode PD at an operational amplifier OA thereof, and converts the input to a voltage signal by a resistor R connected between the input and output of the operational amplifier OA and amplifies the input to output an amplified voltage signal.

Also, an amplifier circuit shown in FIG. 2 receives a current signal input from a photo diode PD at an operational amplifier OA thereof, and converts the input to a voltage signal by a diode D connected between the input and output of the operational amplifier OA and amplifies the input to output an amplified voltage signal.

Also, an amplifier circuit shown in FIG. 3A receives a current signal input from a photo diode PD at a current-mirror type current amplifier circuit 50 to amplify the current and output an amplified current signal.

Also, an amplifier circuit shown in FIG. 4A receives a current signal input from a photo diode PD as it is at an operational amplifier 60 to amplify the current and output an amplified current signal.

Usually, a photo diode has a high output resistance, and the dynamic range of a current signal input from the photo diode is as wide as 1 to 100 μA.

Accordingly, for the current/voltage conversion type amplifier circuits shown in FIGS. 1 and 2, it has been difficult to accommodate for the current signal from such a photo diode to obtain a high conversion accuracy.

An amplifier circuit shown in FIG. 3A, though allows the input dynamic range thereof to be widened, has a high input impedance, so that the circuit is strongly affected by a parasitic capacity such as the junction capacity of a photo diode PD. Accordingly, as shown in an equivalent circuit of FIG. 3B, a phase delay occurs due to the time constant defined by an input resistor Rin and the parasitic capacity at the feedback input terminal of an operational amplifier, thereby causing the frequency band thereof to be limited and the operation of the operational amplifier to become unstable. That is, as shown in a frequency characteristic of FIG. 5, a gain becomes large at a high frequency region, thereby causing a high-accuracy input/output characteristic not to be obtained.

On the other hand, an amplifier circuit shown in FIG. 4A receives a current signal input from a photo diode PD at the feedback input terminal of an operational amplifier 60, so that the input impedance thereof is low, thereby causing the circuit not to be much affected by a parasitic capacity such as the junction capacity of the photo diode PD and the frequency characteristic thereof to be improved.

However, in the amplifier circuit shown in FIG. 4A, no current other than the signal current flows through a signal current detecting transistor of the operational amplifier 60, so that the frequency characteristic varies with the magnitude of the signal current, thereby causing a high-accuracy input-output characteristic not to be obtained. Also, no current other than the signal current flows through an output stage of the operational amplifier 60, so that the output impedance becomes high. Accordingly, as shown in an equivalent circuit of FIG. 4B, a phase delay occurs due to the time constant defined by an output resistor Rout and the parasitic capacity at the feedback input terminal, thereby causing the frequency band thereof to be limited and the operation of the operational amplifier 60 to become unstable.

As described above, such prior art current amplifier circuit has a problem that, where the circuit receives a current signal input from a current signal source having a high output resistance such as a photo diode to amplify the current, the magnitude of the signal current causes the frequency characteristic to be changed, or the time constant depending on the output resistance causes the frequency band to be limited and the operation to become unstable.

SUMMARY OF THE INVENTION

The present invention has been devised to solve the above-described problem, and the purpose thereof is to provide a current amplifier circuit having an improved frequency characteristic and output impedance characteristic to allow a high-accuracy input/output characteristic and a stable operation to be obtained.

The present invention is characterized in that a current amplifier circuit which amplifies a current signal input from a current signal source having a high output resistance and outputs the amplified current, comprising: an operational amplifier which has a feedback loop between an input terminal and an output terminal, and receives the current signal input at the input terminal to amplify the current, the operational amplifier having at an output stage a signal detecting transistor through which a signal current flowing through the feedback loop flows; a bias current adder circuit for allowing a bias current to flow steadily through the signal current detecting transistor of the operational amplifier; a bias current subtracter circuit which has a further transistor through which a current flows of a magnitude equal to the sum current of the signal current flowing through the signal current detecting transistor and the bias current, and subtracts the bias current from the current flowing through the transistor to output only the signal current; and a reference bias generator circuit for determining a magnitude of the bias current.

In the current amplifier circuit configured as described above, a current with a magnitude equal to a reference current of a reference current source flows through each transistor to which a reference bias is applied from the reference bias generator circuit. Thus, the signal current flowing through the feedback loop flows through the signal current detecting transistor on the operational amplifier output stage; and in addition a steady bias current from the bias current adder circuit flows through the signal current detecting transistor, so that the signal current is detected as a sum current together with the bias current by the signal current detecting transistor. Then, a current with a magnitude equal to the sum current of the signal current detecting transistor flows through the further transistor of the bias current subtracter circuit, and the bias current is subtracted from the current flowing through the further transistor, so that only the signal current is obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 2 are circuit diagrams showing a prior art current/voltage conversion type amplifier circuit;

FIG. 3A is a circuit diagram showing a prior art current-mirror type current amplifier circuit;

FIG. 3B is an equivalent circuit diagram to the current amplifier circuit in FIG. 3A;

FIG. 4A is a circuit diagram showing a prior art operational-amplifier type current amplifier circuit;

FIG. 4B is an equivalent circuit diagram to the current amplifier circuit in FIG. 4A;

FIG. 5 is a graph showing a frequency characteristic of a prior art current amplifier circuit;

FIG. 6 is a circuit diagram showing an embodiment of a current amplifier circuit of the present invention;

FIGS. 9, 10, 11, 12 and 13 are circuit diagrams showing other embodiments of the current amplifier circuit of the present invention.

DETAILED DESCRIPTION OF THE PREFERRED EMBODIMENTS

Figure 7:
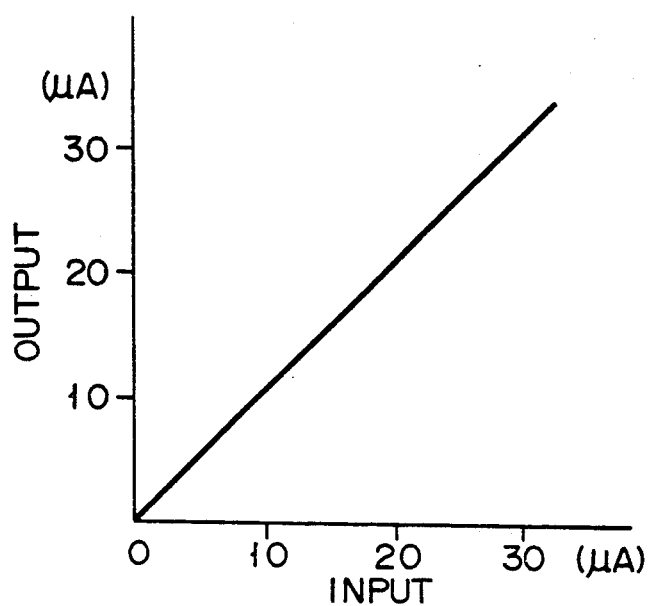
FIG. 7 is a graph showing an input/output characteristic of the current amplifier circuit in FIG. 6.

With reference to the drawings, an embodiment of the present invention will be explained in detail hereinafter.

FIG. 6 shows a current amplifier circuit whose circuit has been integrated, wherein an operational amplifier 10 receives a current signal input from a photo diode PD outside the integrated circuit to amplify the current and output the amplified current signal. The current amplifier circuit, which employs bipolar transistors, comprises the operational amplifier 10, a bias current adder circuit 20 for allowing a bias current to flow continuously through transistors Q8 and Q9 on the output stage of the operational amplifier 10, a bias current subtracter circuit 30 for subtracting the bias current from the output current of the signal current detecting transistor Q9 on the output stage of the operational amplifier 10, and a reference bias generator circuit 40. The reference symbol 1a indicates a signal current input terminal (operational amplifier input terminal), 1b indicates an operational amplifier output terminal, 1c indicates a feedback loop between the input and output terminal of the operational amplifier, 3a indicates a signal current output terminal, Vcc indicates a power potential, and GND indicates a ground potential.

In the above operational amplifier 10, the bases of differentially-amplifying PNP transistors Q1 and Q2 are connected to the operational amplifier input terminal 1a and a bias power source $V_B$, respectively. A constant-current source PNP transistor Q3 is connected between the Vcc potential and the emitter mutually-connected point of the differentially-amplifying PNP transistors Q1 and Q2, and NPN transistors Q4 and Q5 are connected between the collector of the differentially-amplifying PNP transistor Q1 and the GND and between the collector of the differentially-amplifying PNP transistor Q2 and the GND, respectively. The collector and base of the NPN transistor Q4 are connected to each other, and the base of the NPN transistor Q5 is connected to the base of the NPN transistor Q4. That is, the transistors Q4 and Q5 are current-mirror connected to each other.

The collector output of the differentially-amplifying PNP transistor Q2 is connected to the base of an amplifying NPN transistor Q7. A loading PNP transistor Q6 and the amplifying NPN transistor Q7 are connected in series between the Vcc potential and the GND to form an emitter grounded circuit. A phase compensating capacitor C1 is connected between the collector and base of the amplifying NPN transistor Q7. The collector of the transistor Q7 is connected to the base of the NPN transistor Q8, and the signal current detecting NPN transistor Q9 whose collector and base are connected to each other is connected between the emitter of the NPN transistor Q8 and the GND.

The collector of the NPN transistor Q8 comprises the output terminal 1b of the operational amplifier 10, and the emitter and collector of a bias current adding PNP transistor Q10 are connected between the Vcc potential and the output terminal 1b of the operational amplifier 10.

The bias current subtracter circuit 30 comprises: an NPN transistor Q11 current-mirror connected to the signal current detecting NPN transistor Q9; a bias current subtracting PNP transistor Q12 connected between the Vcc potential and the collector of the NPN transistor Q11; a signal current taking-out PNP transistor Q13 whose collector and emitter are connected between the Vcc potential and the collector of the NPN transistor Q11, and whose base and collector are connected to each other; and a signal current outputting PNP transistor Q14 which is current-mirror connected and whose collector is connected to the signal current output terminal 3a.

A reference bias from the reference bias generator circuit 40 is applied to the base of the bias current subtracting PNP transistor Q12. The reference bias generator circuit 40 comprises a reference bias generating PNP transistor Q15 whose base and collector are connected in series between the Vcc potential and the GND, and a reference current source 4a. The potential at the base-collector mutually connected point of the PNP transistor Q15 is supplied as the reference bias.

Also, the reference bias from the reference bias generator circuit 40 is applied to each bases of the constant-current source PNP transistor Q3, the loading PNP transistor Q6 and the bias current adding PNP transistor Q10.

In the current amplification circuit configured as described above, a current with a magnitude equal to the current (reference current) of the reference current source 4a flows through each of the transistors Q3, Q6, Q10 and Q12 to which the reference bias from the reference bias generator circuit 40 is applied. Thus, the signal current flowing through the feedback loop 1c flows through the transistors Q8 and Q9 on the operational amplifier output stage, and in addition a steady bias current from the bias current adding transistor Q10 flows through the transistors, so that the signal current is detected as a sum current together with the bias current by the transistor Q9. Then, a current with a magnitude equal to the current of the signal current detecting transistor Q9 flows through the NPN transistor Q11 of the bias current subtracter circuit 30. Accordingly, the current is equal to the sum current of the current flowing through the bias current subtracting PNP transistor Q12 and the signal current flowing through the signal current taking-out PNP transistor Q13. Accordingly, the bias current is subtracted from the sum current, so that only the signal current is outputted from the signal current outputting PNP transistor Q14.

Figure 8:
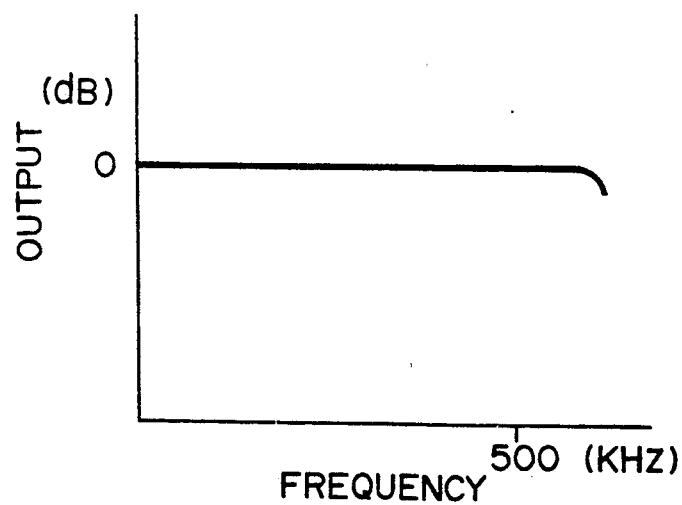
FIG. 8 is a graph showing a frequency characteristic of the current amplifier circuit in FIG. 6.

The input/output characteristic of the current amplifier circuit is shown in FIG. 7, and the frequency characteristic thereof is shown in FIG. 8. The graphs show that the frequency characteristic is flat, and the frequency band widens to about 500 KHz.

That is, according to the above-described current amplifier circuit, the bias current flows steadily through the transistor Q8 on the operational amplifier output stage, so that the characteristic of the operational amplifier 10 becomes stable, thereby allowing the output impedance to be reduced and the frequency characteristic to become stable. Accordingly, even when the current signal from the photo diode PD is inputted into the feedback input terminal 1a of the operational amplifier 10, the input impedance is low, so that the circuit is not much affected by a parasitic capacity such as the function capacity of the photo diode PD, thereby keeping a good frequency characteristic.

FIG. 9 shows another embodiment of a current amplifier circuit of the present invention, which is different from the current amplifier circuit in FIG. 6 in the points described below, so that the same symbols as those in FIG. 6 are assigned. That is, there are differences in that; (1) the emitter and collector of a PNP transistor Q16 are inserted between the collector of the transistor Q10 and the collector of the transistor Q8, diodes D1 through D3 are connected in series and in the forward direction between the Vcc potential and the base of the transistor Q16, and a current source 5 is connected between the base of the transistor Q16 and the GND; (2) the transistors Q9 and Q11 are replaced by NPN transistors Q17 and Q18, the base of the transistor Q17 is connected to the collector and base of the transistor Q18, the base and emitter of a NPN transistor Q19 are connected between the collector of the transistor Q17 and the collector of the transistor Q18, and the collector of the transistor Q12 is connected to the collector of the transistor Q19; and (3) the transistors Q13 and Q14 are replaced by PNP transistors Q20 and Q21, the base of the transistor Q20 is connected to the collector and base of the transistor Q21, the base and emitter of a PNP transistor Q22 are connected between the collector of the transistor Q21 and the collector of the transistor Q20, and the collector of the transistor Q22 is connected to the signal current output terminal 3a.

The operation of the current amplifier circuit in FIG. 9 is performed basically in a similar manner to the operation of the current amplifier circuit in FIG. 6. For this current amplifier circuit, the transistor Q19 lowers the dependence of the current-mirror ratio in a current-mirror circuit comprising the transistors Q17 and Q18 on the current amplification factor hfe and compensates a current shift due to the early effect of the current-mirror circuit, the transistor Q22 lowers the dependence of the current-mirror ratio in a current-mirror circuit comprising the transistors Q20 and Q21 on the current amplification factor hfe and compensates a current shift due to the early effect of the current-mirror circuit, and the diodes D1 through D3 and the transistor Q16 set the collector potential of the transistors Q10 and Q12 to the same potential to compensate a current shift due to the early effect of the transistors Q10 and Q12, whereby the input/output characteristic of the current amplifier circuit becomes highly accurate.

Figure 10:
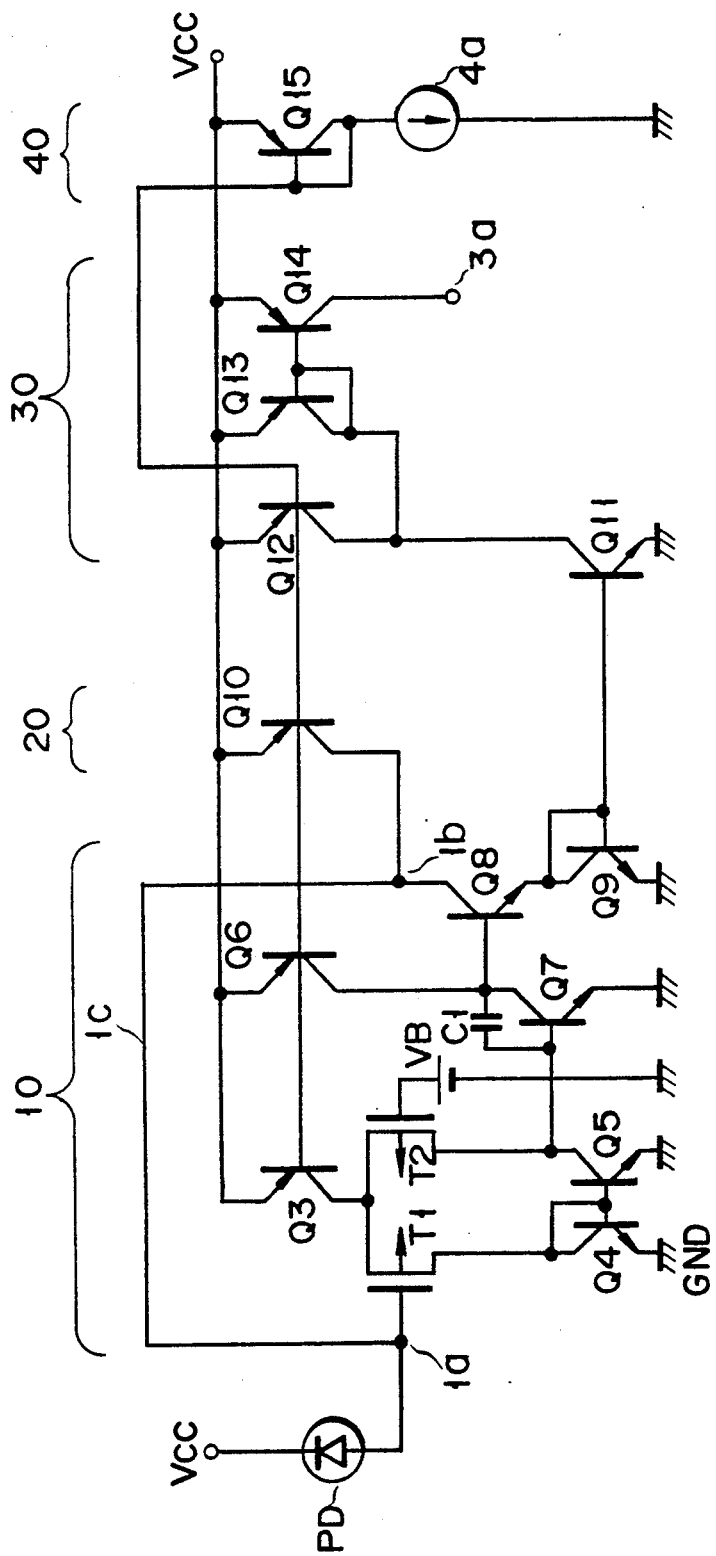

FIG. 10 shows a further embodiment of a current amplifier circuit of the present invention, which is different from the current amplifier circuit in FIG. 6 in that the differentially-amplifying PNP transistors Q1 and Q2 in the operational amplifier 10 are replaced by the P-channel MOS (insulated-gate type) transistors T1 and T2, and those other than the above are substantially the same as those in FIG. 6, so that the same symbols as those in FIG. 6 are assigned to those in FIG. 10.

Although the operation of the current amplifier circuit in FIG. 10 is performed basically in a similar manner to the operation of the current amplifier circuit in FIG. 6, the MOS transistors T1 and T2 are used as a differentiating transistor, thereby allowing the input bias of the operational amplifier 10 to be compensated.

Figure 11:
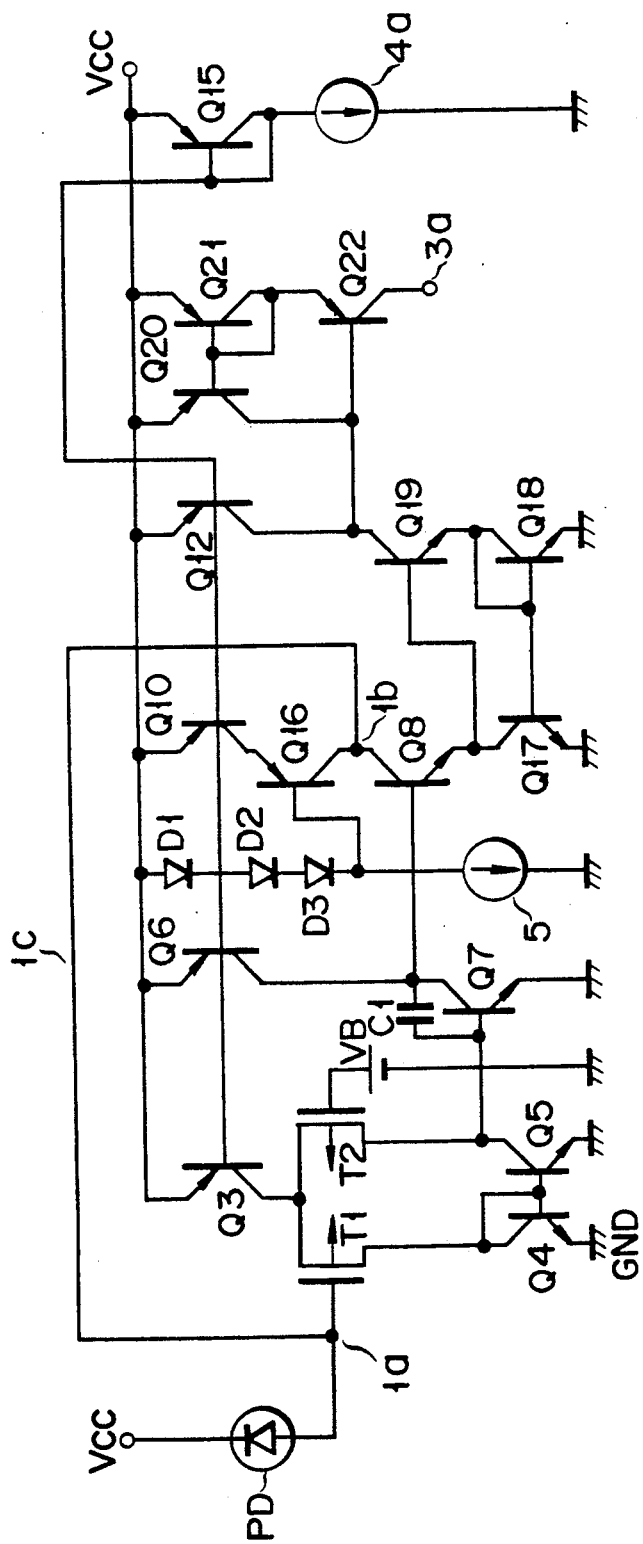

FIG. 11 shows a still further embodiment of a current amplifier circuit of the present invention, which is different from the current amplifier circuit in FIG. 9 in that the differentially-amplifying PNP transistors T1 and T2 in the operational amplifier 10 are replaced by the P-channel MOS (insulated-gate type) transistors T1 and T2, and those other than the above are substantially the same as those in FIG. 9, so that the same symbols as those in FIG. 9 are assigned to those in FIG. 11.

Although the operation of the current amplifier circuit in FIG. 11 is performed basically in a similar manner to the operation of the current amplifier circuit in FIG. 9, the MOS transistors T1 and T2 are used as a differentiating transistor, thereby allowing the input bias of the operational amplifier 10 to be compensated.

Figure 12:
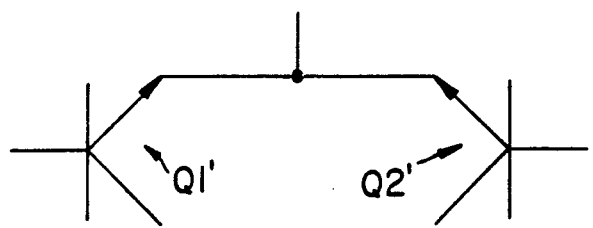
Figure 13:
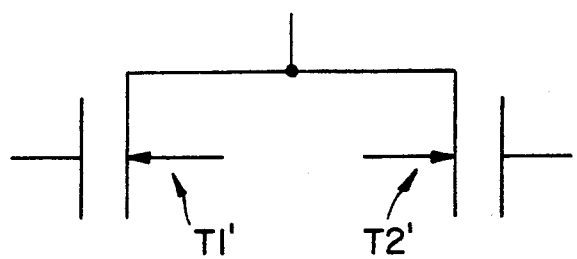

In the embodiments shown in FIGS. 9, 10, and 11, the PNP transistors and the NPN transistors can be replaced by NPN transistors and PNP transistors, respectively. Thus, for example, PNP transistors Q1 and Q2 may be replaced by NPN transistors Q1' and Q2' as shown in FIG. 12. In such cases, the P-channel MOS transistors T1 and T2 should be changed to N-channel MOS transistors. T1' and T2' as shown in FIG. 13. Also, in these cases, the polarities of the power source voltages should be reversed.

According to the present invention as described above, a current amplifier circuit can be implemented whose frequency characteristic and output impedance characteristic may be improved to obtain a highly-accurate input/output characteristic and a stable operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A current amplifier circuit comprising:
   an operational amplifier which has a feedback loop between an input terminal and an output terminal, and receives a current signal input at said input terminal to amplify the current signal, the operational amplifier having at an output stage a signal detecting transistor through which a signal current flowing through said feedback loop flows;
   a bias current adder circuit for allowing a bias current to flow steadily through the signal current detecting transistor of said operational amplifier;
   a bias current subtracter circuit which has a further transistor through which a current flows of a magnitude equal to the sum current of the signal current flowing through said signal current detecting transistor and the bias current, and subtracts the bias current from the current flowing through the further transistor to output only the signal current; and
   a reference bias generator circuit for determining a magnitude of said bias current.

2. The current amplifier circuit according to claim 1, wherein said operational amplifier comprises a constant current source, a pair of differentially-connected transistors, and a current-mirror circuit.

3. The current amplifier circuit according to claim 2, wherein said pair of differentially-connected transistors comprise a pair of bipolar transistors, the base of one of the transistors is connected to said input terminal, and the base of the other of the transistors is connected to a bias potential.

4. The current amplifier circuit according to claim 3, wherein said pair of bipolar transistors are of PNP type.

5. The current amplifier circuit according to claim 3, wherein said pair of bipolar transistors are of NPN type.

6. The current amplifier circuit according to claim 2, wherein said pair of differentially-connected transistors comprise a pair of insulated-gate type field effect transistors, the gate of one of the transistors is connected to said input terminal, and the gate of the other of the transistors is connected to a bias potential.

7. The current amplifier circuit according to claim 6, wherein said pair of field effect transistors are of P-channel type.

8. The current amplifier circuit according to claim 6, wherein said pair of field effect transistors are of N-channel type.

9. The current amplifier circuit according to claim 6, wherein said pair of field effect transistors comprise a pair of metal oxide semiconductor transistors.

10. The current amplifier circuit according to claim 1, wherein said bias current adder circuit comprises a bipolar transistor whose base is controlled by an output potential of said reference bias generator circuit.

11. The current amplifier circuit according to claim 1, wherein said reference bias generator circuit comprises a reference bias generating transistor and a reference current source, which are connected in series between a power potential and a reference potential.

12. The current amplifier circuit according to claim 11, wherein said bias current adder circuit comprises a bipolar transistor controlled by a potential of the connected point of said reference bias generating transistor and said reference current source, which are in said reference bias generator circuit.

13. The current amplifier circuit according to claim 11, wherein said bias current subtracter circuit is connected to said further transistor through which a current equal to said sum current flows, and further includes a bipolar transistor controlled by a potential of the connected point of said reference bias generating transistor and said reference current source, which are in said reference bias generator circuit.

14. The current amplifier circuit according to claim 1, wherein said bias current subtracter circuit is connected to said further transistor through which a current equal to said sum current flow, and further includes a bipolar transistor controlled by an output potential of said reference bias generator circuit.

15. A current amplifier circuit comprising:
   a reference bias generating circuit for generating a reference bias;
   an operational amplifier for amplifying an input current, said operational amplifier including an input terminal for receiving the input current, an output terminal, a feedback loop between said input terminal and said output terminal, and a signal detector through which a signal current of said feedback loop flows;
   a bias current circuit responsive to the reference bias for providing a bias current which flows through said signal detector, whereby a sum current equal to said bias current and said signal current flows through said signal detector; and
   a bias current subtracting circuit having an input current equal to the current through said signal detector and subtracting a current equal to the bias current from the input current to output an output current signal equal to the signal current.

16. The current amplifier circuit according to claim 15, wherein said bias current circuit comprises a first bipolar transistor having a base controlled by the reference bias.

17. The current amplifier circuit according to claim 16, wherein said reference bias generator circuit comprises a second bipolar transistor and a current source connected in series between a power supply potential and a reference potential, the base of said first bipolar transistor coupled to a point between the series-connected second bipolar transistor and current source.

* * * * *